United States Patent [19]

Suzuki et al.

[11] Patent Number: 5,368,982
[45] Date of Patent: Nov. 29, 1994

[54] IMAGE FORMING PROCESS

[75] Inventors: Tamotsu Suzuki, Shizuoka; Tomohisa Tago, Tokyo; Fumiaki Shinozaki, Shizuoka, all of Japan

[73] Assignee: Fuji Photo Film Co., Ltd., Kanagawa, Japan

[21] Appl. No.: 916,969

[22] Filed: Jul. 20, 1992

[30] Foreign Application Priority Data

Jul. 22, 1991 [JP] Japan ................... 3-206292

[51] Int. Cl.$^5$ ................................... G03C 11/12
[52] U.S. Cl. ................... 430/256; 430/258; 430/331; 430/293
[58] Field of Search ........... 430/331, 256, 293, 294, 430/257, 444, 258, 325

[56] References Cited

U.S. PATENT DOCUMENTS

| | | | |
|---|---|---|---|
| 3,091,533 | 5/1963 | Hodgins | 430/331 |
| 3,552,969 | 1/1971 | Henn et al. | 430/444 |
| 4,339,530 | 7/1982 | Sprintschnik et al. | 430/331 |
| 4,873,174 | 10/1989 | Dhillon et al. | 430/309 |
| 4,920,036 | 4/1990 | Totsuka et al. | 430/270 |
| 5,043,247 | 8/1991 | Daems et al. | 430/257 |
| 5,153,111 | 10/1992 | Yoshida et al. | 430/444 |

FOREIGN PATENT DOCUMENTS 62-067529  3/1987  Japan.
91-01515   2/1991  WIPO ................... 430/331

Primary Examiner—Charles L. Bowers, Jr.
Assistant Examiner—John A. McPherson
Attorney, Agent, or Firm—McAulay Fisher Nissen Goldberg & Kiel

[57] ABSTRACT

Disclosed is an image forming process employing a light-sensitive image forming material and a developing solution. The image forming material comprises a support, a peel layer and a light-sensitive resin layer containing a pigment having an anionic group, superposed in order. The process comprises the steps of imagewise exposing the image forming material to light and developing the material by the use of a developing solution having a polymer having the following recurring unit (A):

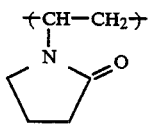

(A)

such as poly(N-vinylpyrrolidone) to form an image on the peel layer.

5 Claims, No Drawings

IMAGE FORMING PROCESS

FIELD OF THE INVENTION

This invention relates to a process for forming an image by imagewise exposing a light-sensitive image forming material to light and developing by the use of a developing solution to form an image which is particularly utilized in the field of printing arts.

BACKGROUND OF THE INVENTION

A light-sensitive image forming material has a layer comprising a light-sensitive resin which is capable of forming an image by imagewise exposure. The light-sensitive resin comes to be soluble or insoluble in a solvent accompanying to its molecular structure change caused by exposure of light. The formation of an image is performed by taking advantage of an above phenomenon of the light-sensitive resin. The light-sensitive image forming material having such light-sensitive resin layer is utilized in the fields of printing plates such as a PS (Presensitized) lithograph and a resin relief plate, photoresists such as a film type photoresist, color proofs in prepress, and lithfilm for dot to dot work.

For example, a light-sensitive image forming material employable for a proof to confirm hue and tone of a finished print has a structure comprising a support (may be referred to as tentative support hereinafter) and a peel layer comprising an organic polymer and a light-sensitive resin layer provided thereon in order. In the case of using the light-sensitive image forming material for an image forming material (light-sensitive transferring sheet) in the surprint method (which is one of color proofing methods), the material is imagewise exposed to light to form an image on the peel layer through developing and then the resultant separation image is transferred to a desired support to prepare a color proofing sheet having the separation image.

Such color proofing sheet is used to confirm hue and tone of a finished print as mentioned above, so that a separation image formed on a light-sensitive image forming material is desired to show a distinct hue.

To form a color image on a light-sensitive image forming material, a colorant material in the light-sensitive resin layer generally uses an organic pigment which is excellent in various characteristics such as richness of hue. In more detail, a color image is obtained by applying a coating solution prepared through mixing the organic pigment and a light-sensitive resin to a peel layer provided on a support to prepare a light-sensitive image forming material, and imagewise exposing the material to light and then removing a soluble portion of the resin layer by developing by the use of a developing solution.

For the purpose of obtaining a color image which is excellent in the above characteristics, Japanese Provisional Patent Publication Nos. 62 (1987)-67529 and 63 (1988)-74052 propose use of a lake pigment (containing chelate pigment) as a colorant material. The lake pigment has an anionic group such as a carboxylic acid group or a sulfonic acid group as a substituent on its molecular, which forms lake with a mono- or di-valent metal ion to produce its metal salt. The lake pigment is generally apt to be insoluble in various coating solutions. Accordingly, in the case of applying a coating solution for the light-sensitive resin layer to other layer (particularly a peel layer), the pigment scarcely dyes the peel layer so that an image having a distinct hue is deemed to be obtained.

The study of the present inventors, however, have revealed that even use of the lake pigment does not give occasionally a distinct image. The inventors have further studied and found that the lake pigment contains in part a pigment which have not formed lake with the metal ion and such pigment is apt to penetrate into the peel layer in the course of provision of a light-sensitive resin layer or development of the resin layer. As a result, the peel layer is dyed by the pigment, i.e., fog of a coloring material is apt to occur on the peel layer.

SUMMARY OF THE INVENTION

To solve the above problem, the inventors have noted a developing solution used in a developing procedure and studied the composition of the solution. For example, a composition of a developing solution used in the above Japanese Provisional Patent Publication No. 62 (1987)-67529 consists of $Na_2CO_3$, methyl cellosolve and water. However, use of such developing solution is apt to bring about occurrence of fog of a coloring material on the peel layer. As a result of the study, it has been revealed that an image formed on a light-sensitive image forming material (a peel layer) can be prevented from the occurrence of fog by addition of poly(N-vinylpyrrolidone) to the developing solution.

An object of the present invention is to provide an image forming process which is capable of forming a distinct image by preventing occurrence of fog of a coloring material (i.e., preventing a peel layer from being dyed).

There is provided by the present invention an image forming process comprising the steps of:

imagewise exposing to light a light-sensitive image forming material comprising either a support, a peel layer provided thereon and a light-sensitive resin layer containing a pigment having an anionic group provided on the peel layer, or a support, a peel layer provided thereon, a colorant layer containing the pigment provided on the peel layer and a light-sensitive resin layer provided on the colorant layer, and developing the image forming material by the use of a developing solution which contains a polymer having the following recurring unit (A):

to form an image on the peel layer.

The embodiments of the present invention are as follows:

1) The image forming process wherein the polymer is a homopolymer of N-vinylpyrrolidone, or a copolymer of N-vinylpyrrolidone and a monomer polymerizable with N-vinylpyrrolidone which contains the recurring unit (A) in the amount of not less than 30 mole %.

2) The image forming process wherein the developing solution contains the polymer having the recurring unit (A) in the concentration from 0.001 to 10 weight %.

3) The image forming process wherein the developing solution contains a silicone type anti-foaming agent (an anti-foaming agent comprising silicone).

4) The image forming process wherein the developing solution contains an alkali metal sulfate type or alkali metal sulfonate type surface active agent.

5) The image forming process wherein the pigment having an anionic group is a lake pigment which is a metal salt of azo dye having at least one selected from the group consisting of a carboxylic acid group and a sulfonic acid group.

6) The image forming process wherein the pigment having an anionic group is a compound represented by the following formula (I):

(I) $[A-N=N-B]^{n-}M^{n+}$ wherein A is a group represented by the following formula (1) or (2):

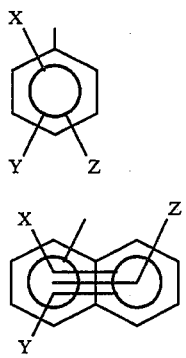

in which X, Y and Z each represents a carboxylic acid group, a sulfonic acid group, an alkyl group of 1 to 12 carbon atoms, an alkoxy group of 1 to 12 carbon atoms, nitro, a halogen atom or hydrogen;
B is a group represented by the following formula (3) or (4):

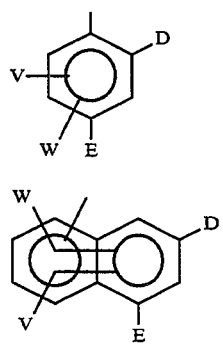

in which V and W each represents a carboxylic acid group, a sulfonic acid group or hydrogen and D and E each represents hydrogen or hydroxy and at least one of D and E is hydroxy; at least one of X, Y, Z, V and W is a carboxylic acid group or a sulfonic acid group;
M represents a metal atom; and
n represents an integer of 1 to 5.

7) The image forming process wherein the a light-sensitive resin layer contains the pigment having an anionic group in the range of 1 to 3 weight %.

The image forming process according to the invention enables the formation of a distinct image on the light-sensitive image forming material (the peel layer). Use of the developing solution containing a polymer having the above recurring unit (A) such as poly(N-vinylpyrrolidone) prevents the peel layer from being dyed by a pigment contained in the lake pigment which does not form lake, whereby an image can be formed without fog of a coloring material. The polymer having the above recurring unit (A) may be hereinafter referred to as poly(N-vinylpyrrolidone) type polymer.

Although it is not necessarily apparent how use of the developing solution containing the poly(N-vinylpyrrolidone) type polymer reduces the fog, it is deemed as follows:

The pigment (lake pigment) having an anionic group such as a carboxylic acid group and a sulfonic acid group which is contained in the photo-sensitivity image forming layer, contains a little amount of pigment which does not form lake. Such pigment, which is easily soluble in a solvent and therefore unstable, is attracted to the poly(n-vinylpyrrolidone) type polymer in the developing solution of the invention. In more detail, the anionic pigment which does not form lake is attracted to a pyrrolidone ring of the polymer, whereby the anionic pigment is prevented from dissolving in the developing solution so that adsorption (dyeing) of the anionic pigment to the peel layer is depressed. Hence, the peel layer of the light-sensitive image forming material is prevented from the occurrence of fog of a coloring material.

Further, adoption of the image forming process of the invention reduces the fog on the peel layer to form a distinct image. Accordingly, the process can be utilized advantageously in formation of a color image on a color proofing sheet by a surprint method.

DETAILED DESCRIPTION OF THE INVENTION

The image forming process according to the present invention basically comprising the following steps:

(1) imagewise exposing to light a light-sensitive image forming material comprising a support, a peel layer and a light-sensitive resin layer containing a pigment having an anionic group (or a colorant layer containing the pigment and a light-sensitive resin layer), superposed in order, to form a latent image in the light-sensitive resin layer and (2) developing the photo-sensitive resin layer (or the colorant layer and a light-sensitive resin layer) using a developing solution containing the above poly(N-vinylpyrrolidone) type resin to remove a soluble portion of the latent image (the light-sensitive resin layer) and then form an image on the peel layer.

The light-sensitive image forming material employable for the process of the invention is prepared according to the process described below.

The support serves for supporting various layers (e.g., a peel layer, and a light-sensitive resin layer) provided thereon. The material of the support preferably has an excellent heat-resistance and chemical-resistance, and flexibility. Further, in the case that an exposing of the material to light is conducted using light applied from the support side, the support is preferred to have a large transmittance at a wavelength of the light source using for the exposure.

Examples of materials of the support include polyesters such as polyethylene terephthalate (PET), polycarbonate, polystyrene, cellulose derivatives such as cellulose triacetate, polyolefins such as polypropylene, polyacrylonitrile, polyvinyl chloride, polyvinylidene chloride, polyacrylates such as PMMA (polymethyl methacrylate), polyamides such as nylon, polyimide and polysulfone. Further, there can be mentioned examples described in Japanese Provisional Patent Publication Nos. 47 (1972)-41830, 48 (1973)-9337 and 51 (1976)-5101. Preferred are polyethylene terephthalate, polycarbonate and heat-treated materials thereof. The thickness of the support is generally in the range of 5 to 300 μm, and preferably in the range of 20 to 150 μm.

On the surface of the support opposite to the peel layer, a back layer comprising a polymer such as polyvinyl butyral, polyvinyl chloride, polyvinyl acetate or cellulose acetate resin may be provided from the viewpoint of improvement of workability. Further, the back layer may be contain various additives such as a matting agent.

On the support is provided the peel layer. Materials employable for the peel layer can be appropriately selected from known materials for the peel layer. Examples of such materials include alcohol-soluble polyamide, polyhydroxystyrene, polyvinyl acetate, poly(meth-)acrylate, polyvinyl chloride, polyvinyl butyral, methyl methacrylate/acrylate (e.g., ethyl acrylate) copolymer, cellulose acetate butyrate, vinyl chloride/vinyl acetate copolymer, cellulose diacetate, cellulose triacetate, polyvinyl alcohol and a composition prepared by blending styrene/partially esterificated maleic anhydride copolymer with methoxymethylated nylon. These materials can be employed singly or in combination. The mixture of alcohol-soluble polyamide and polyhydroxystyrene is preferred.

The peel layer is formed by coating a coating solution prepared through dissolving the above materials in an appropriate solvent on the support and drying the coated layer. The coating solution may be contain various surface active agents for improvement of the surface state of the peel layer. Particularly, fluorine containing surface active agents are preferred. The thickness of the peel layer is generally in the range of 0.1 to 20 μm, preferably in the range of 0.2 to 5 μm and more preferably in the range of 0.3 to 3 μm.

On the peel layer is provided the light-sensitive resin layer. Materials employable for the light-sensitive resin layer can be selected from known light sensitive resin materials. As N→P (negative to positive) type light-sensitive resin (i.e., resin for forming a negative working light-sensitive resin layer), a composition prepared by blending an azide type light-sensitive agent such as 2,6-di(4'-azidobenzal)cyclohexane with a novolak type phenol resin, and a composition prepared by blending a polyfunctional monomer such as trimethylolpropane triacrylate with a photopolymerization initiator such as Michler's ketone using benzyl methacrylate/methacrylic acid copolymer as a binder are preferred. As P→P (positive to positive) type light-sensitive resin (i.e., resin for forming a positive working light-sensitive resin layer), a light-sensitive resin composition containing quinoneazide type light-sensitive agent such as o-quinonediazide is preferred.

The pigment having an anionic group which is contained in the light-sensitive resin layer is preferred to be a lake pigment which is a metal salt (e.g., Ba, Ca or Mn) of azo dye having at least one selected from the group consisting of a carboxylic acid group and a sulfonic acid group. Further, the pigment is particularly preferred to be a compound represented by the following formula (I):

(I) 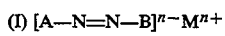

wherein A is a group represented by the following formula (1) or (2):

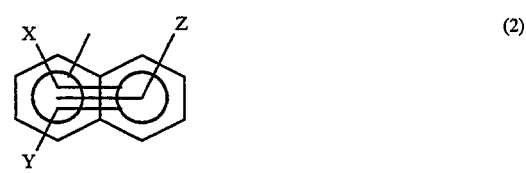

in which X, Y and Z each represents a carboxylic acid group, a sulfonic acid group, an alkyl group of 1 to 12 carbon atoms, an alkoxy group of 1 to 12 carbon atoms, nitro, a halogen atom or hydrogen;

B is a group represented by the following formula (3) or (4):

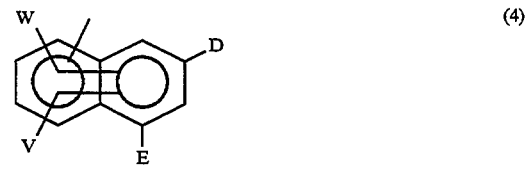

in which V and W each represents a carboxylic acid group, a sulfonic acid group or hydrogen and D and E each represents hydrogen or hydroxy and at least one of D and E is hydroxy; at least one of X, Y, Z, V and W is a carboxylic acid group or a sulfonic acid group;

M represents a metal atom; and n represents an integer of 1 to 5.

In formula (I), substituents represented by X, Y, Z, V and W may be bonded to any carbon atom constituting a ring corresponding to the substituents. Hence, the pigment represented by the formula (I) is a compound that at least one of A and B mentioned above has at least one of carboxylic acid group and sulfonic acid group. Further, a metallic atom represented by M is preferred to be Na, Ca, Ba Sr and Mn.

Examples of pigments represented by formula (I) are as follows:

(I-1) Pigment Red 48 (C.I. 15865)

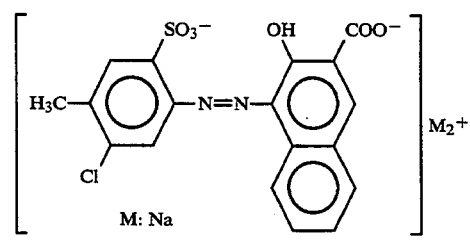

(I-2) Pigment Red 48 (C.I. 15865)
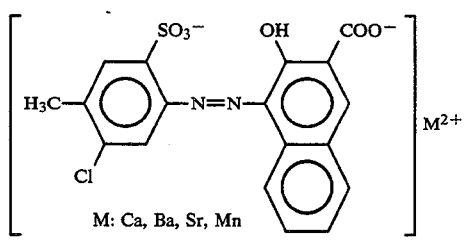
(I-3) Pigment Red 49 (C.I. 15630)
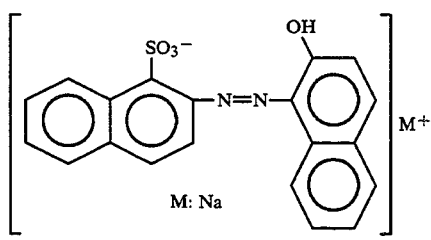
(I-4) Pigment Red 49 (C.I. 15630)
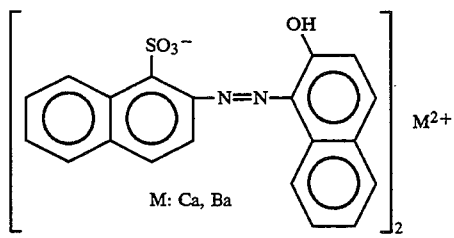
(I-5) Pigment Red 50 (C.I. 15500)
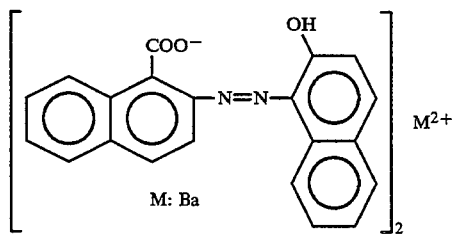
(I-6) Pigment Red 51 (C.I. 15580)
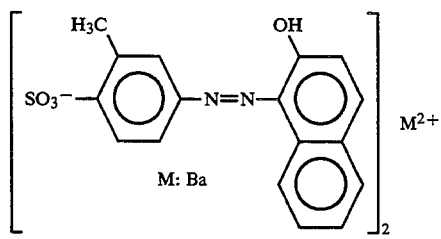
(I-7) Pigment Red 52 (C.I. 15860)
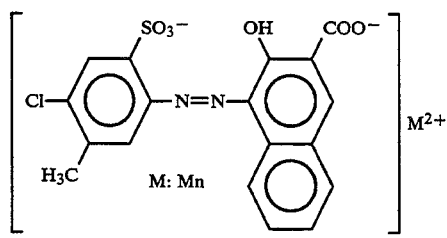
(I-8) Pigment Red 53 (C.I. 15585)
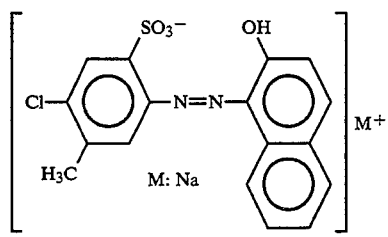
(I-9) Pigment Red 53 (C.I. 15585)
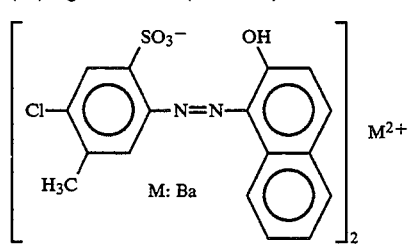
(I-10) Pigment Red 54 (C.I. 14830)
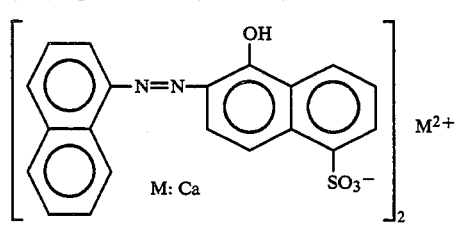
(I-11) Pigment Red 55 (C.I. 15820)
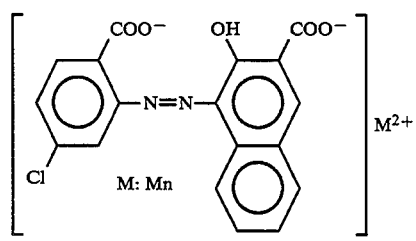
(I-12) Pigment Red 57 (C.I. 15850)
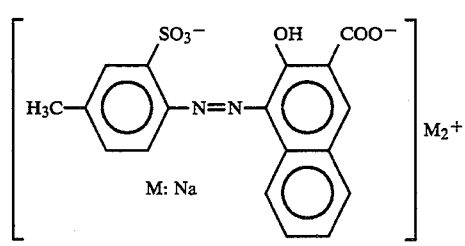
(I-13) Pigment Red 57 (C.I. 15850)
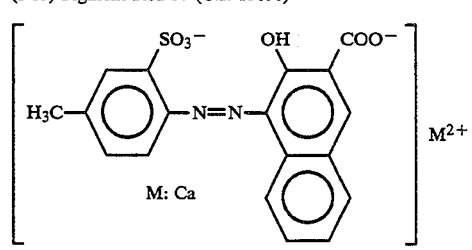
(I-14) Pigment Red 58 (C.I. 15825)

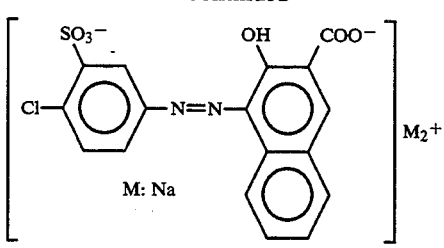

(I-15) Pigment Red 58 (C.I. 15825)

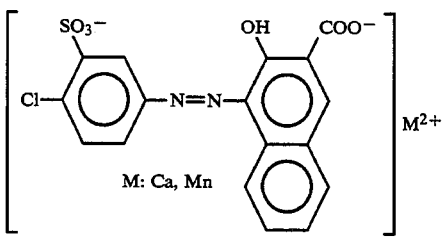

(I-16) Pigment Red 60 (C.I. 16015)

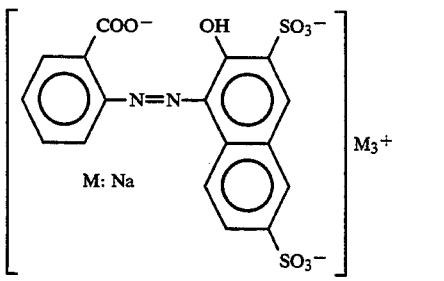

(I-17) Pigment Red 63 (C.I. 15880)

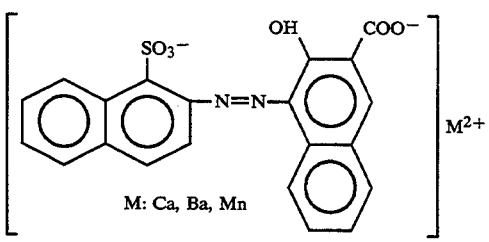

(I-18) Pigment Red 64 (C.I. 15800)

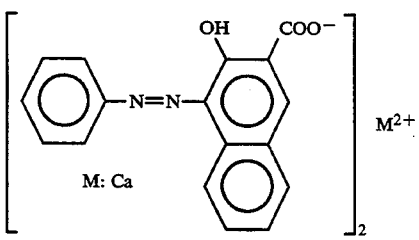

(I-19) Pigment Red 68 (C.I. 15525)

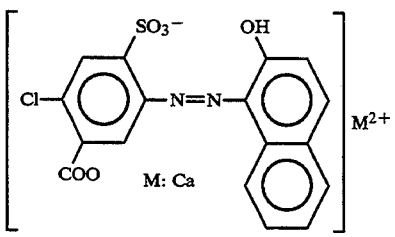

As examples of pigments having the above anionic group, other than the above pigments, there can be mentioned Auramin lake pigments, Acid Green Lake Pigments and Fast Sky Blue Pigments.

The content of the pigment contained in the light-sensitive resin layer, although fluctuates depending on its shape or its particle size, is generally in the range of 1 to 30 weight % based on the weight of the total solid in the layer, and preferably in the range of 2 to 10 weight %.

The light-sensitive resin layer is formed on the peel layer by preparing a coating solution by mixing the light-sensitive resin, the above pigment and an appropriate solvent, coating the resultant solution on the peel layer and then drying the coated layer to form the light-sensitive resin layer. The thickness of the light-sensitive resin layer is generally in the range of 0.5 to 100 μm, preferably in the range of 1.0 to 50 μm and more preferably in the range of 1.0 to 20 μm.

The light-sensitive image forming material used in the image forming process of the invention may have two layers comprising both a colorant layer containing the above pigment provided on the peel layer and a light-sensitive resin layer provided on the colorant layer instead of the light-sensitive resin layer containing the pigment.

The colorant layer is generally a layer comprising the above pigment or both the pigment and resin. As materials of the resin, the resin materials employed in the light-sensitive resin layer as mentioned above can be generally employed. For example, alkali-soluble type resins such as a novolak type phenol resin benzyl methacrylate/methacrylic acid copolymer can be mentioned. Further, it is preferred that a monomer such as polyfunctional monomer and a photopolymerization initiator are also employed.

A light-sensitive resin layer provided on the colorant layer generally is a light-sensitive resin layer containing no pigment, and is the same as the light-sensitive resin layer containing pigment except for containing no pigment.

In the case that the light-sensitive resin is the N→P type, a protective layer is preferably formed on the light-sensitive resin layer. Examples of polymers employable for the protective layer include polyvinyl alcohol, polyvinyl acetate, methyl vinyl ether/maleic anhydride copolymer, poly(N-vinylpyrrolidone), gelatin and gum arabic. The protective layer is formed by coating a solution of the polymer above on the light-sensitive resin layer and drying the coated layer.

The developing solution used in the invention generally is an aqueous alkaline solution containing alkali such as sodium hydroxide, potassium hydroxide, sodium silicate, potassium silicate, trisodium phosphate, tripotassium phosphate, sodium carbonate or potassium carbonate, and a polymer having the following recurring unit (A):

(A)

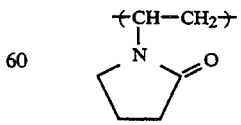

"pH" of the developing solution is preferred to be not less than 9.5.

The polymer containing the repeating unit (A) is preferably a N-vinylpyrrolidone homopolymer (poly(N-vinylpyrrolidone)), or a copolymer of N-vinylpyrrolidone and a monomer polymerizable with N-vinylpyrrolidone which contains the repeating unit (A) in the amount of not less than 30 mole %. Further, the polymer may be a mixture thereof. Furthermore, so long as the repeating unit (A) is contained in the total polymer in the amount of not less than 30 mole %, the polymer may contain other polymers.

The poly(N-vinylpyrrolidone) is a known water-soluble polymer (Known chemical substance register Registered number 6-1048, Structure classification 6-1437 ), which, for example, can be available from GAF corporation (USA).

The copolymer of N-vinylpyrrolidone and a monomer polymerizable with N-vinylpyrrolidone may be any polymer, so long as the repeating unit (A) is contained in the amount of not less than 30 mole % and is capable of dissolving in the developing solution. Examples of monomers polymerizable with N-vinylpyrrolidone include maleic acid, acrylic acid, methacrylic acid, acrylamide and ethylene.

The developing solution generally contains the polymer having the repeating unit (A) in the concentration from 0.001 to 10 weight % and preferably from 0.01 to 2.0 weight %.

The developing solution used in the invention may further contain an alkali metal sulfate type surface active agent and/or an alkali metal sulfonate type surface active agent.

Examples of the alkali metal sulfate type surface active agent include compounds represented by R—O—$SO_3Na$ (alkyl sulfate) and $CH_2(OCOR)CH(OH)CH_2(OSO_3Na)$; wherein R is an alkyl group.

Examples of the alkali metal sulfonate type surface active agent include compounds having basic structures of alkali metal naphthalenesulfonate, alkali metal benzoinimidazolesulfonate and alkali metal benzenesulfonate having an alkyl group of 3-13 carbon atoms.

Examples of the above alkali metal include Li, Na and K, and Na and K are preferred from the viewpoint of saving of cost.

Preferable examples of materials of the alkali metal sulfonate type surface active agent are as follows:

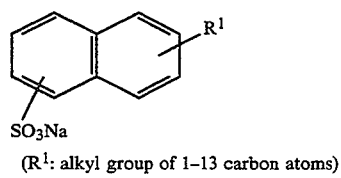

($R^1$: alkyl group of 1-13 carbon atoms)

(S-1)

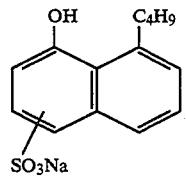

(S-2)

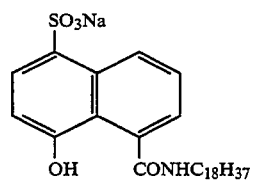

(S-3)

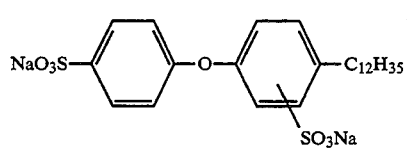

(S-4)

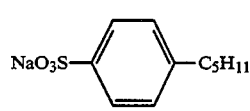

(S-5)

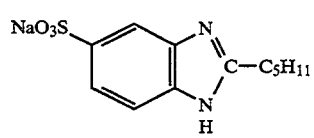

(S-6)

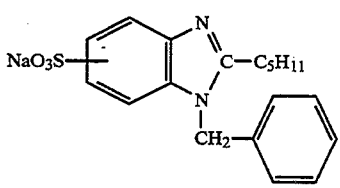
(S-7)

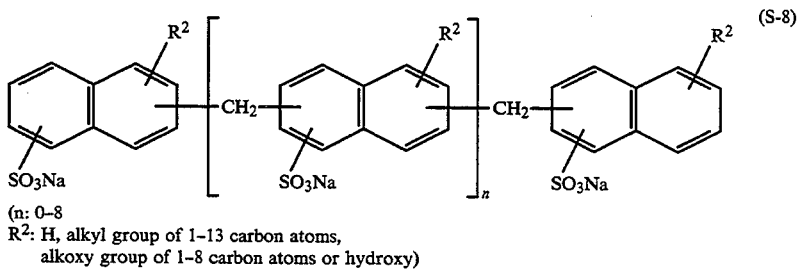
(S-8)

(n: 0–8)
R²: H, alkyl group of 1–13 carbon atoms,
alkoxy group of 1–8 carbon atoms or hydroxy)

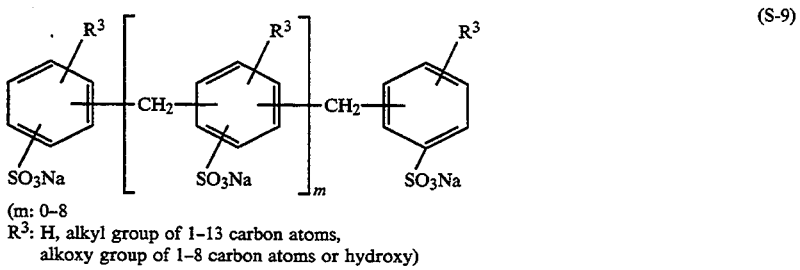
(S-9)

(m: 0–8)
R³: H, alkyl group of 1–13 carbon atoms,
alkoxy group of 1–8 carbon atoms or hydroxy)

(S-10)

(q: 0–3)

The surface active agent is preferably contained in the developing solution in the range of 0.3 to 4.0 weight %, and more preferably in the range of 0.5 to 3.0 weight %.

The developing solution preferably contains a silicone type anti-foaming agent. Examples of the silicone type anti-foaming agent include polydialkylsiloxane (i.e., polydimethylsiloxane), polydiphenylsiloxane or polydialkoxysiloxane. As examples of products of the silicone type anti-foaming agent, there can be mentioned TSF451-500, TSF451-1000, TSF451-1M and TSF3000 (these are trade names of Toshiba Silicone Co., Ltd.). The anti-foaming agent is preferably contained in the developing solution in the range of 0.0001 to 1.0 weight %, and more preferably in the range of 0.001 to 0.1 weight %.

The developing solution preferably contain organic solvents such as benzyl alcohol, methyl cellosolve, ethyl cellosolve, butyl cellosolve and phenyl cellosolve.

The image forming process of the invention is performed except for using the above aqueous alkali solution containing the N-vinylpyrrolidone type polymer as a developing solution, according to a conventional image forming process including imagewise exposure, development and after-treatment which is adopted in the case of forming an image using a light-sensitive resin material.

A process for preparation of a color proofing sheet, for example, can be performed utilizing the process of the invention as follows:

Imagewise exposure is conducted using color separation masks and irradiating the light-sensitive image forming material containing a corresponding colorant (the above pigment having an anionic group) with ultra violet rays. After the imagewise exposure, the material is developed with the above aqueous alkali solution containing the N-vinylpyrrolidone type polymer, washed with water and dried. This procedure is repeated as often as necessary for preparing differently colored elements to obtain the desired separation images with the desired colors. Thus, the obtained image is then transferred to a image receiving layer (sheet) such as paper.

The present invention is further described by the following examples.

EXAMPLE 1

(A) Preparation of light-sensitive image forming material

A coating solution for forming a peel layer having the following composition was prepared.

| Coating solution for peel layer | |
|---|---|
| Alcohol-soluble polyamide (CM-8000, viscosity: 23 cps (20° C.), available from Torey Industries, Inc.) | 7.2 g |

-continued

| Coating solution for peel layer | |
|---|---|
| Polyhydroxystyrene | 1.8 g |
| (Resin M, mean molecular weight: 5,500, available from Maruzen Oil Co., Ltd.) | |
| Methanol | 400 g |
| Methyl cellosolve | 100 g |

The above coating solution was uniformly coated on a polyethylene terephthalate film having the thickness of 100 μm using a whirler, and the coated layer was dried to form a peel layer having thickness of 0.5 μm.

For the purpose of N→P type image formation, a coating solution for forming a light-sensitive resin layer having the following composition was prepared.

| Coating solution for light-sensitive resin layer | |
|---|---|
| Benzyl methacrylate/methacrylic acid copolymer | 60 g |
| (Ratio of copolymerization (molar ratio):73/27, *viscosity η : 0.12) | |
| Pentaerythritol tetraacrylate | 43.2 g |
| Michler's ketone | 2.4 g |
| 2-(o-chlorophenyl)-4,5-diphenylimidazol dimer | 2.5 g |
| Pigment Red 57 (Ca salt) | 5.2 g |
| (Aforementioned pigment No. I-13) | |
| Methyl cellosolve acetate | 560 g |
| Methyl ethyl ketone | 280 g |

*The above "viscosity η" means limiting viscosity in methyl ethyl ketone solution of the polymer at 25° C.

The above coating solution was coated on the peel layer using a whirler, and the coated layer was dried to form a light-sensitive resin layer having thickness of 2.4 μm.

A coating solution for forming a protective layer having the following composition was prepared.

| Coating solution for protective layer | |
|---|---|
| Polyvinyl alcohol | 60 g |
| (GL-05, available from Nippon Synthetic Chemical Industry Co., Ltd.) | |
| Water | 970 g |
| Methanol | 30 g |

The above coating solution was coated on the light-sensitive resin layer using a whirler, and the coated layer was dried to form a protective layer having thickness of 1.5 μm.

Thus, a light-sensitive image forming material comprising the support, the peel layer, the light-sensitive resin layer and the protective layer, superposed in order, was prepared.

(B) Imagewize exposure and development

The light-sensitive image forming material was exposed through a litho-mask (one obtained by imagewise (in image based on a manuscript) exposing a silver-halide photosensitive material to light and developing the material) to a light from a super high-pressure mercury lamp (2 kW) at exposing distance of 50 cm. Thus, a latent image was formed in the light-sensitive resin layer.

The exposed material was developed using the developing solution having the following composition for 20 to 25 minutes at 35° C. to form a red image.

| Developing solution | |
|---|---|
| Na$_2$CO$_3$ | 15 g |
| Butyl cellosolve | 3 g |
| Poly(N-vinylpyrrolidone) | 1 g |
| (Trade name: k-30, available from GAF Corporation (USA)) | |
| Silicone type anti-foaming agent | 0.01 g |
| (TSF-3000, available from Toshiba Silicone Co., Ltd.) | |
| Water | 1000 ml |

(C) Evaluation of formed image

It was observed how a portion (the peel layer) having no image on the light-sensitive resin layer (the formed red image) was stained by the pigment. The observed result (pigment fog) was evaluated according to the following three ranks.

AA: There is little stain of pigment.
BB: There is a little stain of pigment.
CC: There is a significant amount of stain of pigment.
Its evaluation was the rank "AA".

EXAMPLE 2

A light-sensitive image forming material was prepared in the same manner as in Example 1 except preparing a coating solution for a light-sensitive resin layer using Pigment Red 49 (Ca and Ba salts, aforementioned pigment No. I-4) instead of Pigment Red 57 (Ca salt, aforementioned pigment No. I-13).

The obtained light-sensitive image forming material was imagewise exposed to light and developed to form an image in the same manner as in Example 1. The image was evaluated in the same manner as in Example 1, which showed the evaluation of the rank "AA".

COMPARISON EXAMPLE 1

A light-sensitive image forming material was prepared in the same manner as in Example 1.

A developing solution was prepared except for using no poly(N-vinylpyrrolidone) in the same manner as in Example 1.

The obtained light-sensitive image forming material was imagewise exposed to light and developed using the resultant developing solution to form an image in the same manner as in Example. The image was evaluated in the same manner as in Example 1, which showed in the evaluation of the rank "BB".

As is apparent from comparison of each Example and Comparison Example, the red image obtained in each Example showed a distinct image because a portion having no image was little stained by the pigment, while the red image obtained in Comparison Example did not show a distinct image because a portion having no image was stained by the pigment.

We claim:

1. An image forming process comprising the steps of imagewise exposing to light a light-sensitive image forming material comprising either a support, a peel layer provided thereon and a light-sensitive resin layer containing a lake pigment having the formula (I) [A—N=N—B]$^{n-}$M$^{n+}$ wherein
A is a group represented by the following formula (1) or (2):

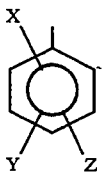
(1)

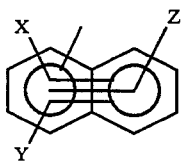 (2)

in which X, Y and Z each represents a carboxylic acid group, a sulfonic acid group an alkyl group of 1 to 12 carbon atoms, an alkoxy group of 1 to 12 carbon atoms, nitro, a halogen atom or hydrogen; B is a group represented by the following formula (3) or (4):

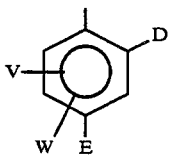 (3)

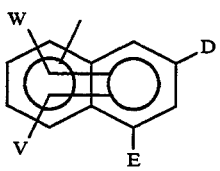 (4)

in which V and W each represents a carboxylic acid group, a sulfonic acid group or hydrogen and D and E each represents hydrogen or hydroxy and at least one of D and E is hydroxy; at least one of X, Y, Z, V and W is a carboxylic acid group or a sulfonic acid group;

M represents a metal atom; and n represents an integer of 1 to 5;

provided on the peel layer, or a support, a peel layer provided thereon, a colorant layer containing the lake pigment provided on the peel layer and light-sensitive resin layer provided on the colorant layer, and developing the image forming material by the use of an aqueous alkaline developing solution which contains a polymer having the following recurring unit (A):

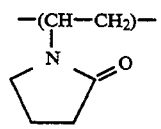 (A)

to form an image on the peel layer.

2. The image forming process as claimed in claim 1, wherein the polymer is a homopolymer of N-vinylpyrrolidone or a copolymer of N-vinylpyrrolidone and a monomer polymerizable with N-vinylpyrrolidone which contains the repeating unit (A) in the amount of not less than 30 mole %.

3. The image forming process as claimed in claim 1, wherein the developing solution contains the polymer having the recurring unit (A) in the concentration from 0.001 to 10 weight %.

4. The image forming process as claimed in claim 1, wherein the developing solution contains a silicone type anti-foaming agent.

5. The image forming process as claimed in claim 1 wherein the developing solution further contains an organic solvent selected from the group consisting of benzyl alcohol, methyl cellosolve, ethyl cellosolve, butyl cellosolve and phenyl cellosolve.

* * * * *